(12) United States Patent
Umehara et al.

(10) Patent No.: US 10,673,409 B2
(45) Date of Patent: Jun. 2, 2020

(54) SAW DEVICE AND METHOD FOR MANUFACTURING SAW DEVICE

(71) Applicant: KYOCERA Corporation, Kyoto-shi, Kyoto (JP)

(72) Inventors: Motohiro Umehara, Yasu (JP); Yutaka Nabeshima, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 408 days.

(21) Appl. No.: 15/529,552

(22) PCT Filed: Nov. 27, 2015

(86) PCT No.: PCT/JP2015/083385
§ 371 (c)(1),
(2) Date: May 25, 2017

(87) PCT Pub. No.: WO2016/084936
PCT Pub. Date: Jun. 2, 2016

(65) Prior Publication Data
US 2017/0324398 A1 Nov. 9, 2017

(30) Foreign Application Priority Data
Nov. 28, 2014 (JP) ................................. 2014-240895

(51) Int. Cl.
*H03H 9/25* (2006.01)
*H03H 9/10* (2006.01)
(Continued)

(52) U.S. Cl.
CPC ............... *H03H 9/25* (2013.01); *H01L 23/04* (2013.01); *H01L 23/08* (2013.01); *H01L 41/23* (2013.01);
(Continued)

(58) Field of Classification Search
CPC .... H03H 9/25; H03H 9/1071; H03H 9/02559; H03H 9/02535; H01L 41/053
(Continued)

(56) References Cited

U.S. PATENT DOCUMENTS

2004/0226162 A1 11/2004 Miura et al.
2005/0167795 A1 8/2005 Higashi
(Continued)

FOREIGN PATENT DOCUMENTS

EP 1433742 A2 6/2004
JP 2004-209585 A 7/2004
(Continued)

OTHER PUBLICATIONS

International Search Report, PCT/JP2015/083385, dated Dec. 28, 2015, 2 pgs.

*Primary Examiner* — Derek J Rosenau
(74) *Attorney, Agent, or Firm* — Volpe and Koenig, P.C.

(57) ABSTRACT

A SAW device includes a SAW element, a conductor connected to the SAW element, an LT substrate including the SAW element, and a case for housing the LT substrate including the SAW element. The case includes a cover part, a lateral part, and a bottom part. The bottom part is including a sapphire substrate, the LT substrate is positioned on a first surface of the sapphire substrate, the first surface serving as an inner surface of the case, and a second surface opposite to the first surface serves as an outer surface of the case. The conductor includes a via conductor provided in a through-hole continuously penetrating through the sapphire substrate and the LT substrate.

13 Claims, 3 Drawing Sheets

(51) Int. Cl.
*H03H 3/08* (2006.01)
*H01L 23/04* (2006.01)
*H01L 23/08* (2006.01)
*H03H 9/02* (2006.01)
*H01L 41/23* (2013.01)
*H01L 41/29* (2013.01)
*H01L 41/312* (2013.01)
*H03H 9/145* (2006.01)

(52) U.S. Cl.
CPC ............ *H01L 41/29* (2013.01); *H01L 41/312* (2013.01); *H03H 3/08* (2013.01); *H03H 9/02559* (2013.01); *H03H 9/1071* (2013.01); *H03H 9/14538* (2013.01); *H01L 2924/0002* (2013.01)

(58) Field of Classification Search
USPC ..... 310/313 R, 313 A, 313 B, 313 C, 313 D, 310/348
See application file for complete search history.

(56) References Cited

U.S. PATENT DOCUMENTS

| | | |
|---|---|---|
| 2005/0194864 A1 | 9/2005 | Miura et al. |
| 2008/0252394 A1* | 10/2008 | Tajima ............... H03H 9/02559 333/133 |
| 2009/0068795 A1 | 3/2009 | Higashi |
| 2011/0146041 A1 | 6/2011 | Miyake et al. |
| 2012/0248933 A1* | 10/2012 | Tsuda ....................... H03H 3/10 310/313 B |

FOREIGN PATENT DOCUMENTS

| | | |
|---|---|---|
| JP | 2005-252550 A | 9/2005 |
| JP | 2009-054982 A | 3/2009 |
| JP | 2014-153345 A | 8/2014 |
| JP | 2014-160706 A | 9/2014 |

* cited by examiner

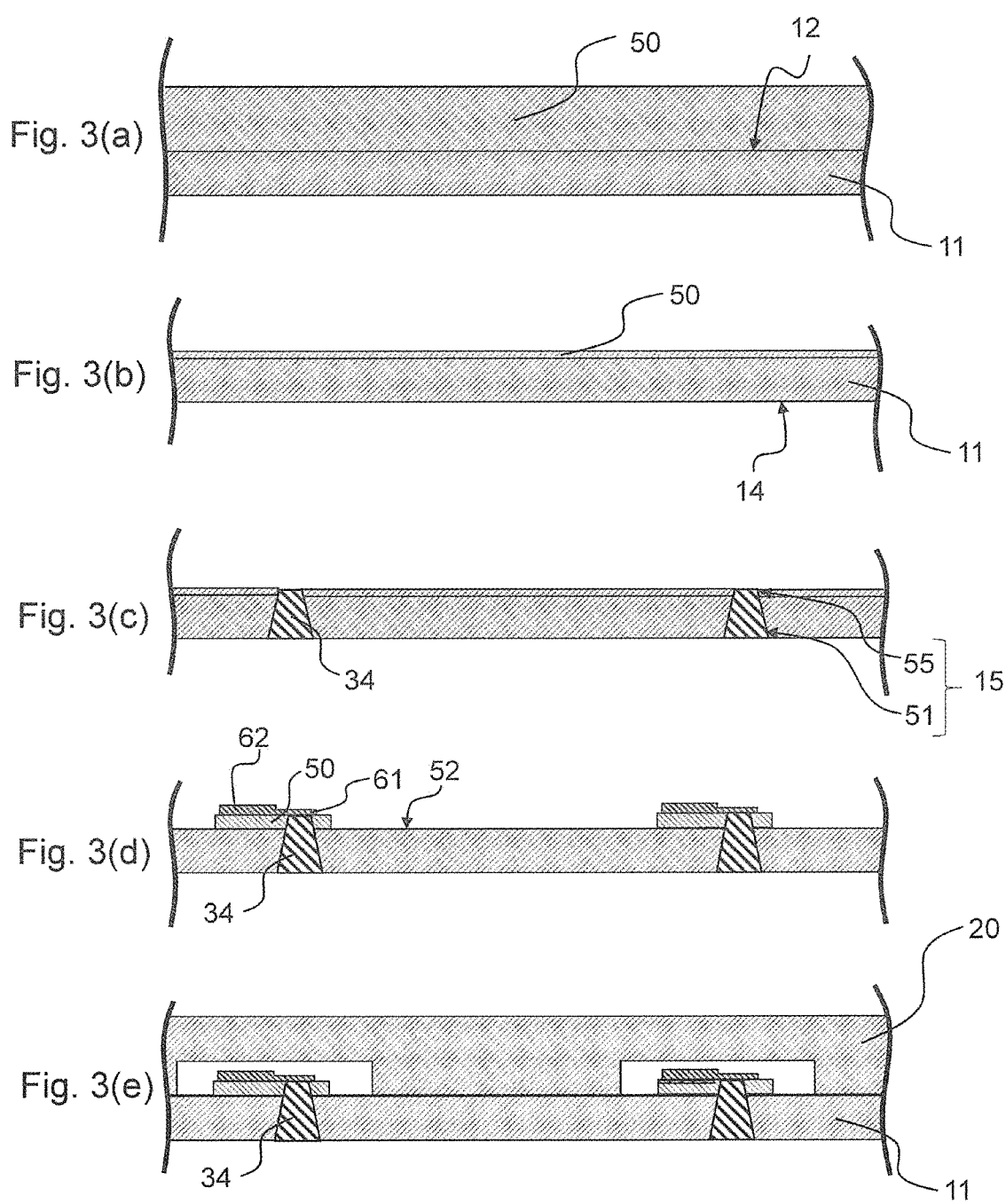

SAW DEVICE AND METHOD FOR MANUFACTURING SAW DEVICE

TECHNICAL FIELD

The present invention relates to a SAW device and a method for manufacturing the SAW device.

BACKGROUND ART

Recently, with increasing miniaturization of electronics such as mobile phone, an electronic device to be used in the electronics is required to be miniaturized. For example, Patent Document 1 discloses an example of a miniaturized electronic device. Lately, a surface acoustic wave (SAW) device is required to be further miniaturized.

RELATED ART DOCUMENT

Patent Document

Patent Document 1: Unexamined Japanese Patent Publication No. 2004-209585

SUMMARY OF THE INVENTION

A SAW device of the present disclosure includes a SAW element, a conductor connected to the SAW element, an LT substrate including the SAW element, and a case for housing the LT substrate including the SAW element. The case includes a cover part, a lateral part, and a bottom part. The bottom part includes of a sapphire substrate, the LT substrate is positioned on a first surface of the sapphire substrate, the first surface serving as an inner surface of the case, and a second surface opposite to the first surface serves as an outer surface of the case. The conductor includes a via conductor provided in a through-hole continuously penetrating through the sapphire substrate and the LT substrate.

A method for manufacturing a SAW device of the present disclosure includes the steps of bonding an LT substrate on a first surface of a sapphire substrate, polishing at least the LT substrate of a bonded body of the sapphire substrate and the LT substrate, forming a through-hole continuously penetrating through the sapphire substrate and the LT substrate, forming a via conductor by filling the through-hole with a conductor, connecting the SAW element to the via conductor by forming a SAW element on the LT substrate, and bonding a bottom part including the sapphire substrate to a cover part and a lateral part or to a cover member including the cover part and the lateral part.

BRIEF DESCRIPTION OF THE DRAWINGS

FIGS. 3(a) to 3(e) are schematic cross-sectional views for describing a method for manufacturing the SAW device.

EMBODIMENT FOR CARRYING OUT THE INVENTION

Figure 1A:
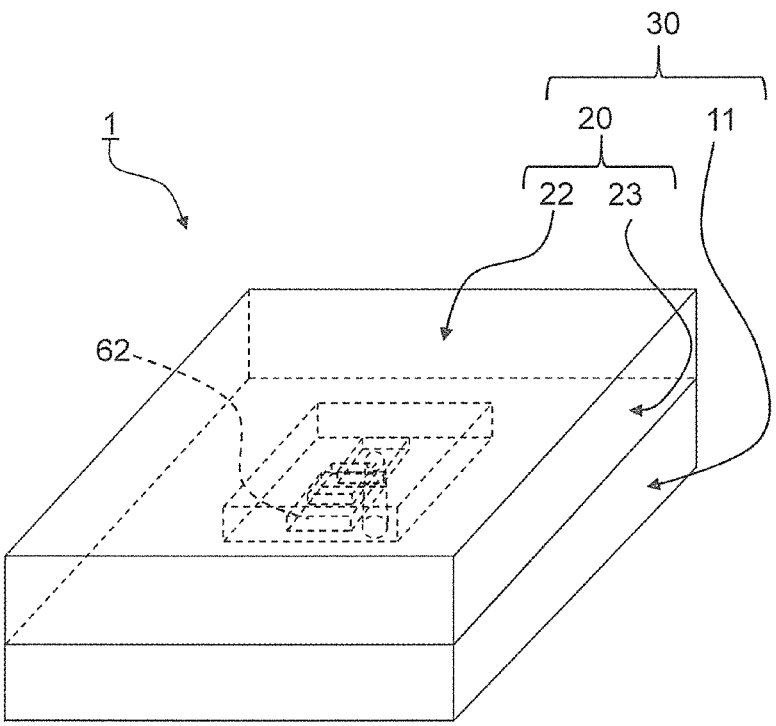
FIGS. 1(a) and 1(b) show a schematic perspective view and a schematic cross-sectional view of a SAW device, respectively in one embodiment.

A surface acoustic wave (SAW) device in the present disclosure includes a sapphire substrate for mounting a lithium tantalate (LT; $LiTaO_3$) substrate including a SAW element. In the SAW device in the present disclosure, the sapphire substrate serves as a part of a case, and a via conductor is formed in a through-hole which continuously penetrates through the sapphire substrate and the LT substrate to serve as a part of a conductor connected to the SAW element. Thus, the SAW device in the present disclosure can be small in size and high in reliability and can be manufactured with less effort and at low cost compared with a conventional one.

Hereinafter, the SAW device and a method for manufacturing the SAW device in the present disclosure will be described. A SAW device 1 shown in FIGS. 1(a) and 1(b) includes a SAW element 62, a conductor 32 connected to the SAW element 62, an LT substrate 50 including the SAW element 62, and a case 30 for housing the LT substrate 50 including the SAW element 62. The case 30 includes a cover part 22, a lateral part 23, and a bottom part 11. The bottom part 11 includes a sapphire substrate, the LT substrate 50 is positioned on a first surface 12 of the sapphire substrate, the first surface serving as an inner surface of the case 30, and a second surface 14 opposite to the first surface 12 serves as an outer surface of the case 30. The conductor 32 includes a via conductor 34 formed in a through-hole 15 which continuously penetrates through the bottom part 11 (hereinafter, referred to as the sapphire substrate 11 as well), and the LT substrate 50.

The through-hole 15 includes a first through-hole 51 penetrating through the sapphire substrate 11 and a second through-hole 55 penetrating through the LT substrate 50. The SAW element 62 is formed on one main surface 52 of the LT substrate 50.

Figure 1B:
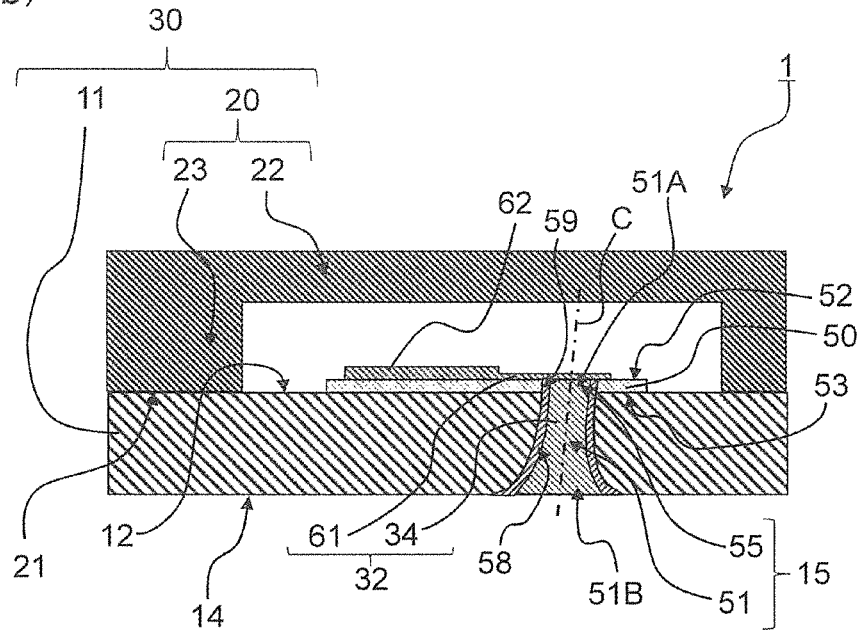

The via conductor 34 is electrically connected to the SAW element 62 through an electrode layer 61 formed on the one main surface 52 of the LT substrate 50. As shown in FIGS. 1(a) and 1(b), the conductor 32 includes the via conductor 34 and the electrode layer 61 formed on the one main surface 52 of the LT substrate 50. As for the via conductor 34, one end is formed in the one main surface 52 of the LT substrate 50, and the other end is formed in the second surface 14 of the sapphire substrate 11.

Here, the second surface 14 serves as the outer surface of the case 30 and the end of the via conductor 34 is formed in the second surface 14 of the sapphire substrate 11, so that when the end is connected to an outside control unit or the like, an electric signal can be received or transmitted. The electric signal can be received into and transmitted from the SAW element 62 through the via conductor 34 and the electrode layer 61. The via conductor 34 and the electrode layer 61 are made of material such as gold (Au). The electric signal includes control data for controlling an operation of the SAW element 62, input data to be processed by the SAW element 62, output data processed by the SAW element 62, and data showing a drive power for driving the SAW element 62 and information detected by the SAW element 62, and thus, the electric signal is not limited in particular, as long as it can be received or transmitted in the form of electricity.

The SAW element 62 has an inter digital transducer (IDT) electrode formed on the one main surface 52 of the LT substrate 50. The IDT electrode is formed by a method such as sputtering or physical vapor deposition and contains material such as gold as a major component. The SAW element 62 may include a capacitor element or an inductor circuit formed on the one main surface 52, other than the IDT electrode.

The bottom part 11 of the case 30 is formed of the sapphire substrate, and the cover part 22 and the lateral part 23 thereof may be also formed of the sapphire substrate. As described above, the case 30 includes the cover part 22, the lateral part 23, and the bottom part 11, but as shown in FIGS. 1(a) and 1(b), the cover part 22 and the lateral part 23 may be integrally provided as a cover member 20. Furthermore, the lateral part 23 and the bottom part 11 may be integrated. Thus, being formed of the sapphire substrate does not only mean containing nothing but sapphire (that is, an alumina single crystal) but also means containing not less than 90% by mass of sapphire.

The LT substrate 50 is formed of lithium tantalate (LT; $LiTaO_3$). Here, being formed of LT does not only mean containing nothing but LT but also means containing not less than 90% by mass of LT.

The SAW device 1 can be small in thickness and made compact because a support substrate for mounting the LT substrate 50 is not housed in the case 30, but the bottom part 11 for mounting the LT substrate 50 serves as the outer part of the case 30. Furthermore, sapphire is high in mechanical strength, so that the SAW device 1 is relatively high in rigidity and hardly cracked or chipped when an impact is applied. When the cover member 20 is formed of sapphire, the whole thickness can be further reduced. In addition, when the bottom part 11 is formed of the sapphire substrate, a thickness of the LT substrate 50 which is relatively fragile can be reduced, so that the whole thickness can be further reduced.

A thickness of the bottom part 11 is 0.05 mm to 1 mm both inclusive, for example. The bottom part 11 formed of sapphire is high in strength, so that even when the thickness is as small as 0.05 mm to 1 mm both inclusive, sufficient strength can be provided. For example, the thickness of the bottom part 11 may be 0.01 mm to 5 mm which is not particularly limited.

Furthermore, sapphire is relatively high in heat conductivity, so that heat emitted from the SAW element 62 can be immediately discharged to an outside of the case 30, for example. In addition, when the bottom part 11 and the cover member 20 are formed of sapphire, the SAW element 62 or the like is hardly exposed to outer air or moisture because sapphire is low in air permeability and water permeability, so that the function of the SAW element 62 or the like can be hardly reduced.

As described above, in the SAW device 1, since the conductor 32 includes the via conductor 34 formed in the through-hole 15 continuously penetrating through the bottom part 11 and the LT substrate 50 to enable the connection to the outside control unit, it is not necessary to draw a conductor from the outside of the case 30 into the case 30, or to install an electrode layer in the case 30, so that the manufacturing method can be simplified, and the planar size can be reduced. A length of an outer circumference of the SAW device 1 (a circumference of the cover member 20) in planar view is about 5 mm to 5 cm, for example.

Furthermore, a cross-sectional diameter of the via conductor 34 provided in the through-hole 15 can be relatively large compared with that of a conductive line such as bonding wire, so that a connection condition between the via conductor 34 and the SAW element is hardly deteriorated mechanically and electrically. Furthermore, the via conductor 34 is used to reduce the connection with the bonding wire, so that it is not necessary to install the wire over a relatively large space, whereby the SAW device 1 can be further made compact. In addition, since a complicated step of installing the bonding wire or the like can be omitted, the SAW device can be manufactured at relatively low cost.

As for the first through-hole 51 penetrating through the sapphire substrate 11 in the SAW device 1, an opening diameter in the second surface 14 is larger than an opening diameter in the first surface 12. More specifically, the diameter of the first through-hole 51 gradually increases with the distance from the first surface 12 toward the second surface 14. The via conductor 34 is formed in such a manner that metal paste is applied into the through-hole 15 and subjected to heat treatment, so that as the diameter gradually increases, a diameter of the via conductor 34 also increases with the distance from a side close to the SAW element 62 toward the outside of the case 30. In addition, the via conductor 34 functions as a conduction path of the heat emitted from the SAW element 62. Since the diameter of the via conductor 34 increases with the distance from the side close to the SAW element 62 toward the outside of the case 30, the heat emitted from the SAW element 62 is diffused in the via conductor 34 and efficiently transmitted toward the outside of the case. In this configuration, a high heat dissipation property is provided.

For example, a diameter of an opening 51A in the first surface 12 of the first through-hole 51 is about 70 μm, and a diameter of an opening 51B in the second main surface 14 of the first through-hole 51 is about 100 μm. Furthermore, when the first through-hole 51 has a circular cross-sectional shape over a whole region from the opening 51A to the opening 51B, no corner part is provided therein, so that even when a thermal stress is generated between the first through-hole 51 and the via conductor 34 or the bottom part 11, stress concentration starting from the corner part is hardly generated. In this configuration, the bottom part 11 can be prevented from being damaged due to the thermal stress.

Furthermore, as for the first through-hole 51 in the SAW device 1, a center axis C connected between a center of the opening 51A in the first surface 12 and a center of the opening 51B in the second surface 14 is tilted with respect to a vertical line of the first surface 12. Thus, the via conductor 34 is not likely to escape from the through-hole 15. The through-hole 15 can be easily formed by a method using laser, which will be described below.

In addition, the first through-hole 51 includes a first modified part 58 including polycrystalline alumina and formed on at least one part of its inner surface. The first modified part 58 is softer than the single-crystal sapphire. When a stress due to thermal expansion and shrinkage of the via conductor 34 is applied to the inner wall of the first through-hole 51, the stress can be relaxed by the relatively soft first modified part 58, so that the inner wall part having the first modified part 58 can be prevented from being damaged in the first through-hole 51. When the first through-hole 51 has the first modified part 58 formed of polycrystalline alumina in the whole inner surface, the inner wall of the first through-hole 51 can be more surely prevented from being damaged due to the above stress.

Furthermore, the second through-hole 55 penetrating through the LT substrate 50 has a second modified part 59 including polycrystalline alumina, on at least one part of its inner surface close to the first through-hole 51. When the second modified part 59 is provided, the relatively fragile LT substrate 50 is prevented from directly receiving an impact from the outside through the via conductor 34. When the second through-hole 55 has the second modified part 59 formed of polycrystalline alumina in the whole inner surface instead of being formed only on the inner surface close to the first through-hole 51, the inner wall of the second through-hole 55 can be more surely prevented from being damaged in the LT substrate 50.

When the bottom part 11 and the cover member 20 are both formed of sapphire, an opposed surface 21 of the cover member 20 and the first surface 12 of the bottom part 11 which are provided face to face with each other are bonded by solid-phase bonding technique using atomic force. For example, the first surface 12 and the opposed surface 21 are activated by irradiation with ion beams in a vacuum atmosphere, and then the activated first surface 12 and activated opposed surface 21 are directly abutted and bonded at normal temperature. Furthermore, instead of the solid-phase bonding technique, the first surface 12 and the opposed surface 21 may be bonded with a bonding agent or the like. However, in view of preventing an operation defect of the SAW element 62 due to out-gas from the bonding agent, it is preferable to use the solid-phase bonding instead of using the bonding agent.

Figure 2:
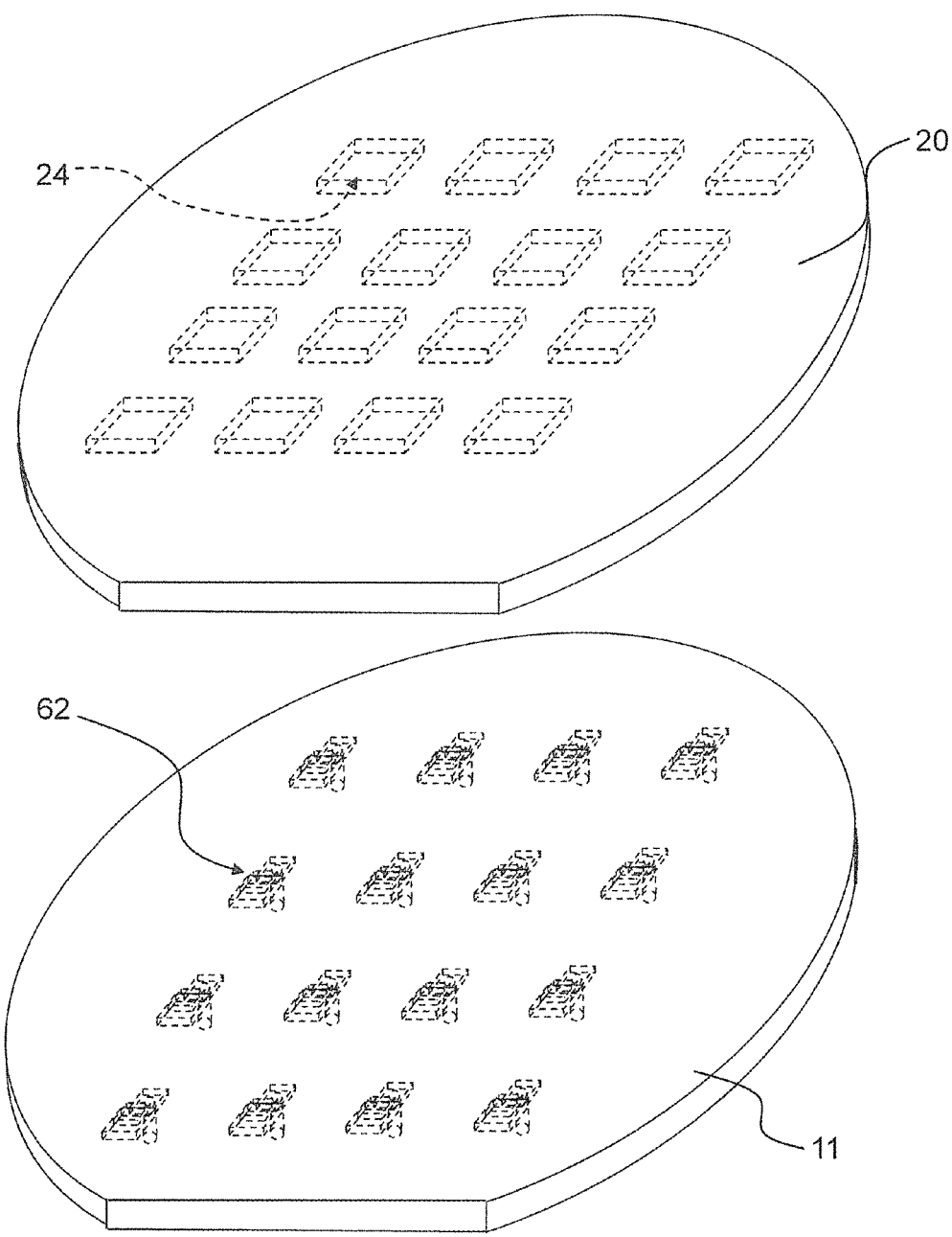
FIG. 2 is a schematic perspective view of a condition in a step of manufacturing the SAW device.

Hereinafter, the method for manufacturing the SAW device in this embodiment will be described. FIG. 2 is a perspective view of a condition in a step of manufacturing the SAW device 1. FIGS. 3(a) to 3(e) are schematic cross-sectional views for describing the method for manufacturing the SAW device 1. In the following description in FIGS. 2 and 3(a) to 3(e), each part during the manufacturing process is marked with the same reference character as used for the part after the manufacturing process in FIGS. 1(a) and 1(b).

In the following manufacturing method, a description will be given to a case where a plurality of SAW devices 1 are manufactured at the same time on a sapphire wafer.

More specifically, as shown in FIG. 2, a first member is manufactured by forming the plurality of SAW elements 62 on the sapphire substrate 11, and a second member serving as the cover member 20 is manufactured by forming a plurality of recessed portions 24 in a sapphire substrate. Then, the first member and the second member are bonded. After that, the bonded members are cut by, for example, dicing or the like, whereby the plurality of SAW devices 1 are manufactured.

The method for manufacturing the SAW device 1 includes a bonding step (FIG. 3(a)) of bonding the LT substrate 50 on the first surface 12 of the sapphire substrate 11, a polishing step (FIG. 3(b)) of polishing at least the LT substrate 50 of the bonded body of the sapphire substrate 11 and the LT substrate 50, a through-hole forming step (not shown) of forming the through-hole 15 which continuously penetrates through the sapphire substrate 11 and the LT substrate 50, a via conductor forming step (FIG. 3(c)) of forming the via conductor 34 by filling the through-hole 15 with a conductor, a forming and connecting step (FIG. 3(d)) of forming the SAW element 62 on the LT substrate 50 and connecting the SAW element 62 to the via conductor 34, and a bonding step (FIG. 3(e)) of bonding the bottom part 11 including the sapphire substrate to the cover member 20. In addition, instead of the cover member 20, the cover part 22 and the lateral part 23 may be used. In the through-hole forming step, the through-hole 15 is formed by laser irradiation from the second main surface 14 of the sapphire substrate 11.

First, as shown in FIG. 3(a), the sapphire substrate 11 having the first main surface 12, and the LT substrate 50 are prepared. For example, the sapphire substrate 11 has thickness of about 100 µm. The sapphire substrate 11 having the thickness of 100 µm is relatively high in strength so that it can be easily handled without being largely bent under its own weight. The LT substrate 50 has thickness of about 250 µm. Although LT is extremely fragile compared with sapphire, the LT substrate 50 having a relatively large thickness of 250 µm has strength to the extent that it can be easily handled without being largely bent under its own weight. These substrates are bonded by the above-described solid-phase bonding technique, for example.

After that, the LT substrate 50 side in the bonded body of the sapphire substrate 11 and the LT substrate 50 is polished by mechanical polishing or chemical mechanical polishing (CMP), for example, and the thickness of the LT substrate 50 is reduced to about 25 µm (FIG. 3(b)). Here, relatively fragile LT is easily cracked and it is difficult to thinly polish itself. However, according to this embodiment, since the LT substrate 50 is bonded to the sapphire substrate 11, the bonded body of the sapphire substrate 11 and the LT substrate 50 has a relatively high strength. Thus, in this embodiment, the LT substrate 50 can be as relatively thin as about 25 µm. Thus, since the LT substrate 50 is bonded to the sapphire substrate 11, the LT substrate 50 can be easily handled without being largely bent or cracked under its own weight even when its thickness is reduced to about 25 µm.

After that, the through-hole 15 is formed in the bonded body of the sapphire substrate 11 and the LT substrate 50 by irradiation of short-pulse laser, for example. For example, YAG laser having a spot diameter of 0.1 mm and a pulse width of 0.2 ms or less is continuously applied from the second main surface 14 of the sapphire substrate 11 to form the through-hole 15 (the first through-hole 51 and the second through-hole 55) which continuously penetrates through the sapphire substrate 11 and the LT substrate 50. A direction of the center axis C of the through-hole 15 can roughly coincide with a direction of the laser irradiation, so that the direction of the center axis C of the through-hole 15 can be controlled by adjusting the direction of the laser irradiation.

Furthermore, as the through-hole 15 is formed by the irradiation of the short-pulse laser from the second main surface 14, apart close to the second main surface 14 is cumulatively irradiated and receives more energy, so that a diameter at the part close to the second main surface 14 is likely to become large. Thus, by the irradiation of the short-pulse laser from the second main surface 14, the first through-hole 51 can be formed such that the diameter increases with the distance from the first main surface 12 toward the second main surface 14. Furthermore, when the through-hole 15 is formed by the laser irradiation, single-crystalline sapphire is melted by the mono-pulse laser irradiation once and then solidified after it has been cooled down in a relatively short time, whereby polycrystalline alumina is formed on the inner surface of the first through-hole 51. Thus, the first modified part 58 can be formed on the inner surface of the first through-hole 51. When the polycrystalline alumina is also formed to enter the LT substrate 50, the second modified part 59 formed of polycrystalline alumina can be also formed on the inner surface of the second through-hole 59.

Subsequently, the through-hole 15 is filled with the conductor to form the via conductor 34 (FIG. 3(c)). Here, metal paste may be squeezed in the through-hole 15 with a squeegee or the like, for example. Alternatively, the via conductor 34 may be formed in such a manner that a wire containing metal such as gold as its major component is inserted into the through-hole 15 and the wire is deformed by heat or pressure so that the through-hole 15 is filled with metal.

After that, the SAW element 62 is formed on the LT substrate 50, and the SAW element 62 is connected to the via conductor 34 through the electrode layer 61 (FIG. 3(d)). The SAW element 62 may be formed on the surface of the LT substrate 50 by a thin-film formation technique including a film formation technique such as photolithography technique or etching technique. After the SAW element 62 has been formed, or at the same time as the SAW element 62 is formed, the electrode layer 61 containing gold as a major component, for example, is formed on the one main surface 52 of the LT substrate 50 by sputtering or physical vapor deposition, for example.

Subsequently, as shown in FIG. 3(e), the sapphire substrate 11 processed through the steps in FIGS. 3(a) to 3(d) is bonded to the cover member 20 by the solid-phase bonding method, for example. In this embodiment, the cover member 20 is manufactured by forming the plurality of recessed portions 24 in the second sapphire substrate (refer to FIG. 2) by photolithography technique or etching technique, for example.

After the step in FIG. 3(e), the bonded body is divided into the plurality of regions by dicing, for example, whereby the plurality of SAW devices 1 shown in FIGS. 1(a) and 1(b) are manufactured.

In the above, the embodiment of the present invention has been described, but the present invention is not limited to the above embodiment and may be variously modified, improved, or combined without departing from the scope of the present invention.

DESCRIPTION OF THE REFERENCE NUMERAL

1: SAW device
11: Bottom part (Sapphire substrate)
15: Through-hole
20: Cover member
22: Cover part
23: Lateral part
32: Conductor
34: Via conductor
50: LT substrate
51: SAW element
61: Electrode layer

The invention claimed is:

1. A surface acoustic wave (SAW) device comprising:
a SAW element;
a conductor connected to the SAW element;
an LT substrate including the SAW element; and
a case for housing the LT substrate including the SAW element, wherein
the case includes a cover part, a lateral part, and a bottom part,
the bottom part includes a sapphire substrate, the LT substrate is positioned on a first surface of the sapphire substrate, the first surface serving as an inner surface of the case, and a second surface opposite to the first surface serves as an outer surface of the case,
the conductor includes a via conductor provided in a through-hole continuously penetrating through the sapphire substrate and the LT substrate, and
the through-hole includes a first through-hole penetrating through the sapphire substrate has a center axis connected between a center of an opening in the first surface and a center of an opening in the second surface, and the center axis is tilted with respect to a vertical line of the first surface.

2. The SAW device according to claim 1, wherein
an opening diameter of the first through-hole in the second surface is larger than an opening diameter of the first through-hole in the first surface.

3. The SAW device according to claim 2, wherein
the diameter of the first through-hole gradually increases with the distance from the first surface toward the second surface.

4. The SAW device according to claim 1, wherein
the first through-hole penetrating through the sapphire substrate has a modified part including polycrystalline alumina, on at least one part of an inner surface.

5. The SAW device according to claim 4, wherein
the first through-hole has the modified part formed of polycrystalline alumina, on the whole inner surface.

6. The SAW device according to claim 4, wherein
a second through-hole penetrating through the LT substrate is provided and has the modified part including polycrystalline alumina, on an inner surface close to the first through-hole.

7. The SAW device according to claim 6, wherein
the second through-hole has the modified part formed of polycrystalline alumina, on the whole inner surface.

8. The SAW device according to claim 1, wherein
the sapphire substrate has thickness of 0.05 mm to 1 mm both inclusive.

9. The SAW device according to claim 1, wherein
the LT substrate is thinner than the sapphire substrate.

10. A surface acoustic wave (SAW) device comprising:
a SAW element;
a conductor connected to the SAW element;
an LT substrate including the SAW element; and
a case for housing the LT substrate including the SAW element, wherein
the case includes a cover part, a lateral part, and a bottom part,
the bottom part includes a sapphire substrate, the LT substrate is positioned on a first surface of the sapphire substrate, the first surface serving as an inner surface of the case, and a second surface opposite to the first surface serves as an outer surface of the case,
the conductor includes a via conductor provided in a through-hole continuously penetrating through the sapphire substrate and the LT substrate, and
the first through-hole penetrating through the sapphire substrate has a modified part including polycrystalline alumina, on at least one part of an inner surface.

11. The SAW device according to claim 10, wherein
the first through-hole has the modified part formed of polycrystalline alumina, on the whole inner surface.

12. The SAW device according to claim 10, wherein
a second through-hole penetrating through the LT substrate is provided and has the modified part including polycrystalline alumina, on an inner surface close to the first through-hole.

13. The SAW device according to claim 12, wherein
the second through-hole has the modified part formed of polycrystalline alumina, on the whole inner surface.

* * * * *